US012573834B2

(12) United States Patent
Chambon

(10) Patent No.: US 12,573,834 B2
(45) Date of Patent: Mar. 10, 2026

(54) ELECTRONIC PROTECTION DEVICE FOR AN ELECTRICAL LOAD, POWER SUPPLY SYSTEM FOR AN ELECTRICAL LOAD AND METHOD FOR CONTROLLING SUCH A DEVICE

(71) Applicant: Schneider Electric Industries SAS, Rueil Malmaison (FR)

(72) Inventor: Patrick Chambon, Saint Martin d'Heres (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 152 days.

(21) Appl. No.: 18/539,387

(22) Filed: Dec. 14, 2023

(65) Prior Publication Data

US 2024/0222952 A1     Jul. 4, 2024

(30) Foreign Application Priority Data

Jan. 4, 2023     (FR) ...................................... 2300079

(51) Int. Cl.
H02H 3/08 (2006.01)
G01R 19/165 (2006.01)
(Continued)

(52) U.S. Cl.
CPC ......... H02H 3/08 (2013.01); G01R 19/16538 (2013.01); H02H 1/0007 (2013.01);
(Continued)

(58) Field of Classification Search
CPC .......... H02H 3/08; H02H 1/0007; H02H 3/18; H02H 11/003; G01R 19/16538; H03K 17/18
(Continued)

(56) References Cited

U.S. PATENT DOCUMENTS 9,893,508 B2 *    2/2018   Sun ........................... H02H 3/08
11,070,045 B1 *   7/2021   Li ........................... H02H 3/207
(Continued)

FOREIGN PATENT DOCUMENTS

CN        112840517 A      5/2021
JP        2021128118 A     9/2021

OTHER PUBLICATIONS

French Search Report and Written Opinion dated Aug. 3, 2023 for corresponding French Patent Application No. FR2300079, 7 pages.

*Primary Examiner* — Thienvu V Tran
*Assistant Examiner* — Lucy M Thomas
(74) *Attorney, Agent, or Firm* — Wolf, Greenfield & Sacks, P.C.

(57) ABSTRACT

An electronic protection device for a load includes an arrangement of transistors in series with the load, that can be controlled into a state out of on and off states, an off state being from among first and second off states. The electronic protection device further includes: a current sensor; a control module connected to the current sensor and controlling the arrangement of transistors into its second off state if an intensity measured by the current sensor is above a first threshold; and a voltage sensor connected to the control module. The control module controls the arrangement of transistors into its on state if the voltage is above a voltage threshold and into its first off state if the intensity is below a second threshold.

20 Claims, 3 Drawing Sheets

(51) Int. Cl.

| | |
|---|---|
| *H02H 1/00* | (2006.01) |
| *H02H 3/18* | (2006.01) |
| *H02H 9/02* | (2006.01) |
| *H02H 11/00* | (2006.01) |
| *H03K 17/18* | (2006.01) |

(52) U.S. Cl.
CPC ............ *H02H 3/18* (2013.01); *H02H 11/003* (2013.01); *H03K 17/18* (2013.01)

(58) Field of Classification Search
USPC ....................................................... 361/93.1
See application file for complete search history.

(56) References Cited

U.S. PATENT DOCUMENTS

| | | | |
|---|---|---|---|
| 2011/0227640 A1 | 9/2011 | Kyono | |
| 2021/0044206 A1 | 2/2021 | Kolos et al. | |
| 2024/0178652 A1* | 5/2024 | Domejean ............... | H02H 3/20 |

* cited by examiner

ELECTRONIC PROTECTION DEVICE FOR AN ELECTRICAL LOAD, POWER SUPPLY SYSTEM FOR AN ELECTRICAL LOAD AND METHOD FOR CONTROLLING SUCH A DEVICE

TECHNICAL FIELD

The present invention relates to an electronic protection device for an electrical load, a power supply system for an electrical load and a method for controlling such a protection device.

BACKGROUND

To protect the electrical devices from the overcurrents which can occur in an electrical circuit, it is known practice to use devices which make it possible to break the circulation of the electrical current, notably circuit breakers. A specific implementation of the circuit breakers implementing transistors is already known; and such circuit breakers produced based on transistors are also called SSCB (for Solid State Circuit Breakers).

However, the SSCBs do not protect the devices connected to the electrical circuit against other phenomena that can damage the devices.

SUMMARY

The aim of the present invention is to remedy the above-mentioned drawback, by proposing an electronic protection device which, in addition to protecting the devices connected to the electrical circuit against overcurrents, protects them against polarity reversals, the protection device aiming also to provide a protection against reversals of current draining the electrical energy stored in the devices into the electrical circuit, while limiting the losses with respect to the existing circuit breakers.

To this end, the subject of the invention is an electronic device for protecting an electrical load against an overcurrent of an electrical current, the protection device comprising:

an arrangement of at least one transistor designed to be connected in series with the load, the arrangement of at least one transistor comprising two conduction poles and a control pole and being controllable, via its control pole, into a state out of an on state in which the current circulates between the conduction poles, and an off state in which the current does not circulate between the conduction poles, the off state being from among a first off state and a second off state;

a current sensor configured to measure an intensity of the current intended to circulate through the load;

a control module connected to the current sensor and configured to control the arrangement of at least one transistor via its control pole, the control module being configured to control the arrangement of at least one transistor into its second off state if the intensity of the current, measured by the current sensor, is above a first intensity threshold;

a voltage sensor connected to the control module and configured to measure a voltage between the conduction poles of the arrangement of at least one transistor; and the control module being further configured to control the arrangement of at least one transistor into its on state from its first off state if the voltage between the conduction poles, measured by the voltage sensor, is above a voltage threshold; and into its first off state if the intensity of the current, measured by the current sensor, is below a second intensity threshold, distinct from the first intensity threshold.

One idea on which the invention is based is to implement a diode in an SSCB. The diode is then a "virtual" diode, by contrast to the real diodes produced in the form of a dedicated component, such as silicon diodes. The virtual diode is implemented via the transistor or transistors of the SSCB, and is driven by the control module of the SSCB. Thus, it is no longer necessary to add a diode connected to the load, in addition to a circuit breaker, the invention making it possible to obtain both functions, circuit breaker and diode, in one and the same device. In addition, the implementation of the virtual diode makes it possible to reduce the losses in the electrical system with respect to a real diode.

According to other advantageous aspects of the invention, the device comprises one or more of the following features, taken alone or in any technically possible combination:

the arrangement of at least one transistor is configured to revert to the on state from the second off state only following rearming by a user, and the control module is configured to maintain the arrangement of at least one transistor in the second off state in the absence of rearming by the user;

the arrangement of at least one transistor comprises several transistors connected in series and/or in parallel;

the electronic protection device further comprises an energy dissipation module connected in parallel to the arrangement of at least one transistor, the dissipation module being configured to dissipate a magnetic energy associated with the electrical current, upon the switching of the arrangement of at least one transistor into its off state; and the second intensity threshold is below the first intensity threshold.

Also a subject of the present invention is a power supply system for an electrical load, comprising a plurality of electrical energy conversion devices, each conversion device being designed to be connected to a corresponding electrical energy source, each conversion device being configured to convert a first electrical energy received as input from the respective source into a second electrical energy delivered as output, a plurality of electronic protection devices, each protection device being connected at the output of a respective conversion device and designed to be connected to the electrical load to supply to it the second electrical energy delivered by the respective conversion device, each protection device being as defined hereinabove.

According to other advantageous aspects of the invention, the system comprises one or more of the following features, taken alone or in any technically possible combination:

at least one conversion device is a device for converting alternating electrical energy into direct electrical energy; and at least one conversion device is a device for converting direct electrical energy into direct electrical energy.

Also a subject of the present invention is a method for controlling an electronic device for protecting an electrical load against an overcurrent of an electrical current, the protection device being as defined hereinabove, the method comprising:

a first step of measurement, by the current sensor, of the intensity of the current circulating through the load;

a step of control, by the control module, of the arrangement of at least one transistor into its second off state if the intensity of the current, measured in the first measurement step, is above a first intensity threshold;

a second step of measurement, by the voltage sensor, of the voltage between the conduction poles of the arrangement of at least one transistor; and in the control step, the arrangement of at least one transistor is controlled into its on state from its first off state by the control module, if the voltage between the conduction poles, measured in the second measurement step, is above a voltage threshold; and, in a control step, the arrangement of at least one transistor is controlled into its first off state by the control module, if the intensity of the current, measured in the first measurement step, is below a second intensity threshold, distinct from the first intensity threshold.

According to another advantageous aspect of the invention, the control method comprises the following feature:

the values of the voltage threshold, of the first intensity threshold and of the second intensity threshold are modifiable by a user, when using the electronic protection device.

BRIEF DESCRIPTION OF THE DRAWINGS

The invention will be better understood on reading the following description, given purely as a nonlimiting example and with reference to the drawings in which.

DETAILED DESCRIPTION

Figure 1:
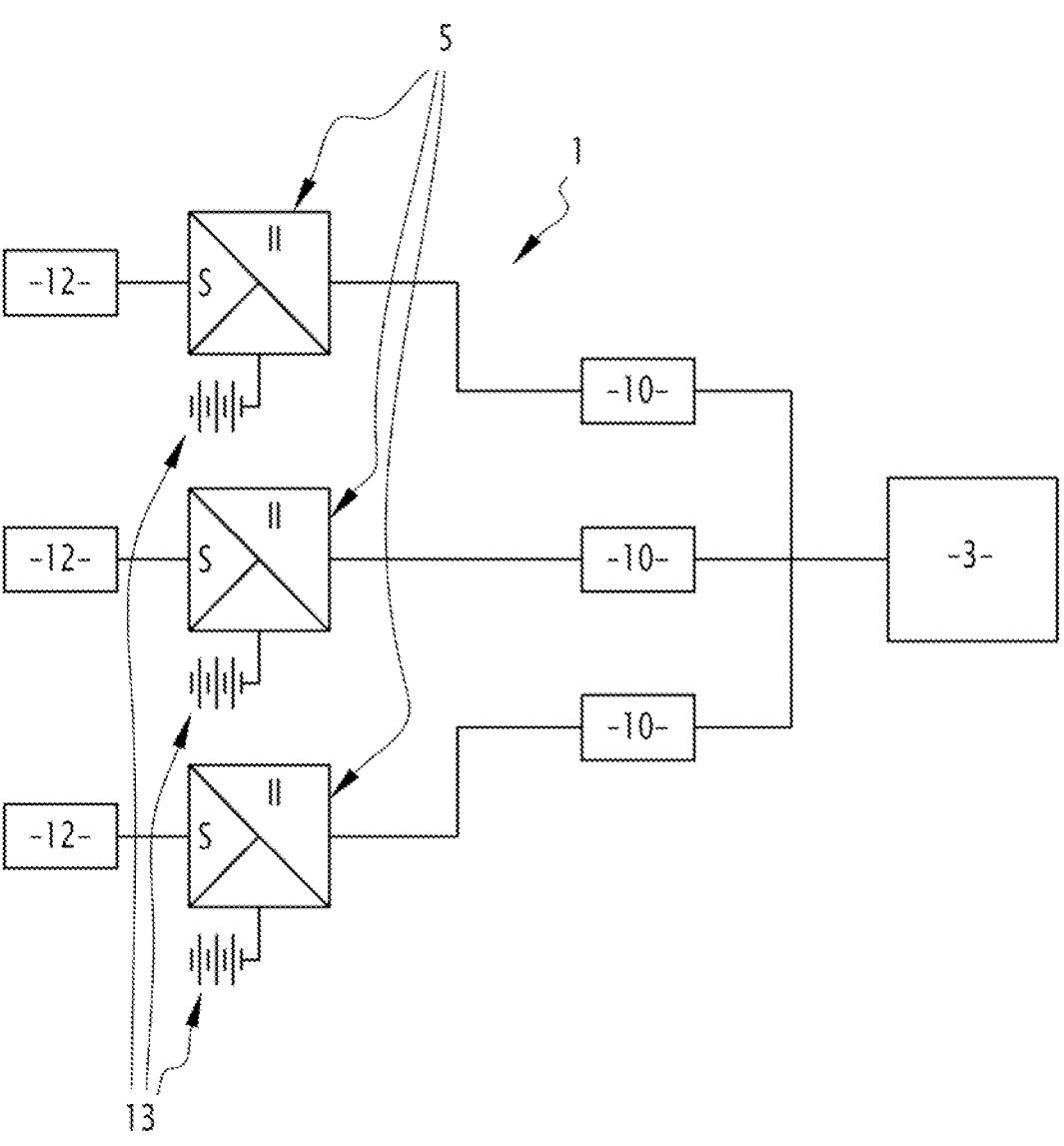
FIG. 1 is a schematic view of a redundant electrical power supply system for an electrical load, the system comprising three electronic protection devices, conforming to the invention.

In FIG. 1, a power supply system 1 of an electrical load 3 comprises several electrical energy converters 5 and several electronic protection devices 10. In the example of FIG. 1, the power supply system 1 comprises three electrical energy converters 5 and three protection devices 10.

Each converter 5 is designed to be connected to a respective electrical energy source 12. These sources 12 are for example external alternating current sources. The alternating current originates, for example, from alternating current generators or from electrical networks, to which the converters 5 are connected. In FIG. 1, the energy sources 12 are separate.

According to a variant that is not represented, each converter 5 is linked to one and the same electrical energy source 12.

Alternatively, or in addition, each converter 5 is advantageously designed to be connected to a direct current source 13. These direct current sources 13 are, for example, batteries. Each converter 5 is linked to a respective direct current source 13, as shown in FIG. 1, and the power supply system 1 is then linked to several direct current sources 13. In a variant that is not represented, each converter 5 is linked to one and the same direct current source 13, and the power supply system 1 is then linked to a single direct current source 13.

Each converter 5 is configured to convert an alternating current into direct current, and/or a direct current into direct current depending on whether it is connected to a respective alternating energy source 12 and/or to a respective direct current source 13. A first converter 5 is for example configured to convert direct current into direct current, while the other two converters 5 are configured to convert alternating current into direct current, all combinations being possible.

Each converter 5 is connected at the output to an electronic protection device 10.

In a variant that is not represented, each protection device 10 is directly linked to a respective direct energy source 13, without a converter between the protection device 10 and the energy source 13.

Each electronic protection device 10 is typically connected at the output to a load 3, such that the load 3 is powered by the converters 5, which supply the direct current to it. The load 3 is any device that needs to be powered by direct current, for example a battery, an electronic device such as a laptop computer or a server. Thus, in the example of FIG. 1, three distinct electrical circuits power the load 3. In the event of overcurrent in one of the electrical circuits, the corresponding protection device 10 is designed to cut the circulation of the current in the electrical circuit exhibiting the overcurrent.

Figure 2:
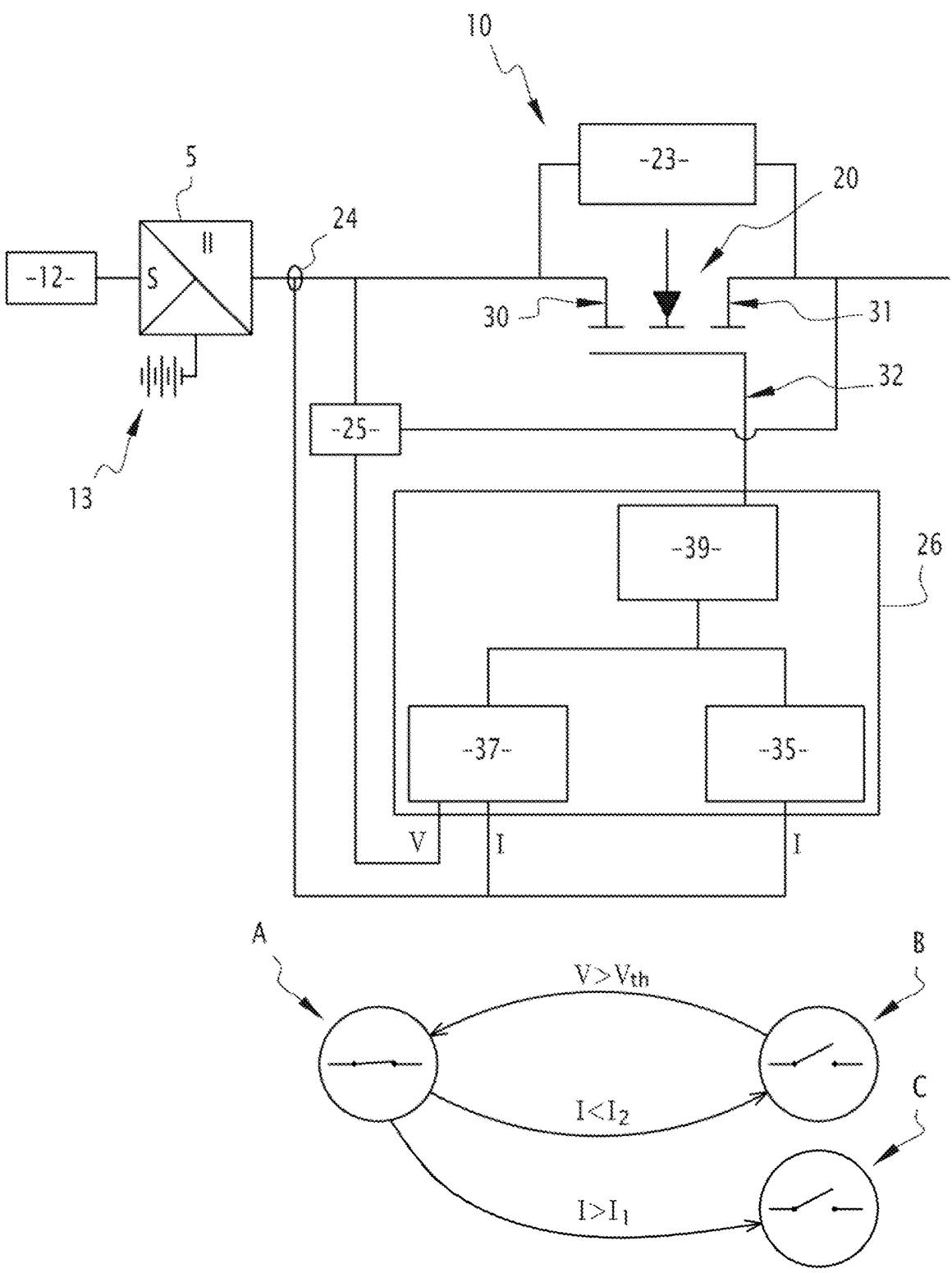
FIG. 2 is a schematic representation of one of the electronic protection devices of FIG. 1, conforming to the invention, and of a state machine associated with the operation of the protection device.

The upper part of FIG. 2 represents the electronic protection device 10 comprising an arrangement of at least one transistor 20, an energy dissipation module 23, a current sensor 24, a voltage sensor 25 and a control module 26.

The electronic protection device 10 is connected at the output of the converter 5, and the output of the protection device 10 is connected to the load 3. In particular, the arrangement of at least one transistor 20 is connected at the output of the converter 5, and the output of the arrangement of at least one transistor 20 is connected to the load 3.

The arrangement of at least one transistor 20 comprises two conduction poles 30 and 31, also called conduction terminals 30 and 31, and a control pole 32, also called control terminal 32. Each transistor of the arrangement of at least one transistor 20 is for example produced in silicon, or even in gallium nitride or silicon carbide.

The arrangement of at least one transistor 20 is controllable, via its control pole 32, into a state out of an on state A in which the current circulates between the conduction poles 30, 31, and at least one off state B or C in which the current does not circulate between the conduction poles 30, 31. These on A and off B, C states are described in more detail hereinbelow.

The arrangement of at least one transistor 20 is configured to cut the current bidirectionally into the at least one off state B, C, that is to say regardless of the direction of circulation of the current, from the source 12 to the load 3, or else from the load 3 to the source 12.

The arrangement of at least one transistor 20 is for example composed of a single transistor with a bidirectional current breaking capacity, as represented in FIG. 2.

In a variant, the arrangement of at least one transistor 20 is an assembly of transistors connected in parallel and/or in series. According to this variant, the arrangement of at least one transistor 20 is then an assembly of transistors connected in series; or an assembly of transistors connected in parallel; or even an assembly of transistors connected in series and in parallel, the assembly then comprising several branches of transistors mounted in parallel, with at least one branch comprising several transistors connected in series, and preferably each branch comprising several transistors connected in series.

According to this variant, the transistors in parallel are present to conduct enough current, and limit the losses. Some transistor technologies are capable of breaking the current only in one direction, so the transistors in series are advantageously connected head-to-tail to allow bidirectional current breaking.

The arrangement of at least one transistor 20 comprises, for example, insulated-gate field-effect transistors, also called MOSFET (for Metal Oxide Semiconductor Field Effect Transistor); field-effect transistors (without insulated gate), also called FET (for Field Effect Transistor), or insulated-gate bipolar transistors, also called IGBT (for Insulated Gate Bipolar Transistor); or even a combination of these different transistors. More generally, the arrangement of at least one transistor 20 comprises at least one controllable switching semiconductor component.

The energy dissipation module 23 is connected in parallel to the arrangement of at least one transistor 20, that is to say between the conduction poles 30 and 31. The energy dissipation module 23 makes it possible to dissipate the magnetic energy stored in a circuit, for example into cables of the circuit, when the circuit is opened. The energy dissipation module 23 is for example a transil diode, configured to clip the overvoltage peaks when the circuit is opened, or a varistor.

The current sensor 24 is connected to the control module 26. It is configured to measure the intensity of the current intended to circulate in the load 3, by measuring the intensity of the current for example at the input of the protection device 10. The current sensor 24 consists for example of a Rogowski coil, made of a semiconductor element placed in a magnetic circuit, or even a shunt resistor, the voltage of which is measured in order to deduce therefrom the intensity of the current which passes through it.

The voltage sensor 25 is connected to the conduction poles 30 and 31 of the arrangement of at least one transistor 20 on the one hand and to the control module 26 on the other hand. It is configured to measure the voltage at the terminals of the conduction poles 30 and 31. The voltage sensor 25 consists for example of a voltage divider device using electrical resistors.

The control module 26 is configured to control the control pole 32 of the arrangement of at least one transistor 20. The control module 26 is adapted to fulfil a solid-state circuit breaker function, symbolised by the solid-state circuit breaker function 35, and also—according to the invention—a diode function, symbolised by the diode function 37, based on the intensity and voltage measurements supplied by the current sensor 24 and the voltage sensor 25. The control module 26 is then configured to receive a value of intensity I of the current intended to circulate through the load 3, measured by the current sensor 24, then to compare the intensity value I received to a first intensity threshold $I_1$ and to a second intensity threshold $I_2$. The control module 26 is then configured to receive also a voltage value V, measured between the conduction poles 30 and 31 by the voltage sensor 25, then to compare the voltage value V to a voltage threshold $V_{th}$. More specifically, the solid-state circuit breaker function 35 uses the intensity value I measured by the current sensor 24, and the diode function 37 uses both the intensity value I and the voltage value V measured respectively by the current sensor 24 and the voltage sensor 25.

Advantageously, the control module 26 is configured to perform a certain number of operations, notably in order to process the intensity and voltage values respectively measured by the intensity 24 and voltage 25 sensors. These operations comprise, for example, the use of a first and a second low-pass filters. The intensity I is processed by the first low-pass filter, and the voltage V is processed by the second low-pass filter.

In a variant, the low-pass filters are replaced by more complex filters.

The filters used are configured to eliminate the measurement noise, and therefore render the operation of the control module 26 more stable.

In the case where the voltage sensor 25 measures only a potential at each conduction pole 30 and 31, the control module 26 is advantageously configured to perform the subtraction of the values of the potentials measured by the voltage sensor 25 in order to obtain the voltage V at the terminals of the conduction poles 30 and 31. This voltage V is then typically processed by the second filter.

The control module 26 is configured to control the arrangement of at least one transistor 20 via its control pole 32, and is therefore adapted to fulfil a function of control of the arrangement of at least one transistor 20, symbolised by a control function 39. The circuit breaker 35 and diode 37 functions are linked at the output to the control function 39 which symbolises the control of the issuing of a control signal, received by the control pole 32, in order to control the arrangement of at least one transistor 20. The control function 39 is advantageously adapted to process data at the output of the circuit breaker 35 and diode 37 functions, for example by being designed to perform a logical "AND" operation on the data.

In practice, it is possible for the circuit breaker 35, diode 37 and control 39 functions not to be implemented distinctly within the control module 26, but in the form of a single global function within the control module 26 for example.

The state diagram of the protection device 10 is represented in the bottom part of FIG. 2. If the intensity I is below the second intensity threshold $I_2$, the protection device 10 switches from the on state A, also called closed state, to a first off state B, also called first open state, and the control module 26 is in particular configured to control the arrangement of at least one transistor 20 into its first off state B. The first off state B is then comparable to an off configuration of a diode. If the voltage V is above the voltage threshold $V_{th}$, the protection device 10 switches from the first off state B to the on state A, and the control module 26 is in particular configured to control the arrangement of at least one transistor 20 into its on state A. Thus, in the case of a bad connection leading to a polarity reversal, or current reversal, the protection device 10 opens the circuit.

If the intensity I is above the first intensity threshold $I_1$, the first intensity threshold $I_1$ and the second intensity threshold $I_2$ being distinct intensity thresholds, the protection device 10 switches from the on state, to a second off state C, also called second open state, and the control module 26 is in particular configured to control the arrangement of at least one transistor 20 into its second off state C. When the protection device 10 is in the second off state C, even if the voltage V is above the voltage threshold $V_{th}$, the protection device 10 is not able to switch back to the on state A. The second off state C is then comparable to a configuration triggered by a circuit breaker. Only a control by a user, whether manually or digitally, makes it possible to switch the protection device 10 from the second off state C to the on state A, that is to say have the protection device 10 revert to the on state A from the second off state C.

The implementation of a diode in the form of the diode function 37 in the protection device 10 makes it possible to avoid the use of a real diode, such as a silicon diode, in addition to a circuit breaker or another device for protecting the electrical circuit against overcurrents. Also, a real diode needs to be voltage-powered, and thereby consumes a non-zero electrical power, for example of the order of 0.7*I for a silicon diode. On the other hand, implementing a diode function 37 in the protection device 10 makes it possible to eliminate this energy consumption, the additional consumption of the protection device 10 compared to an equivalent protection device without the diode function 37 being negligible. The protection device 10 therefore makes it possible to save energy by comparison to a conventional installation with a real diode.

Figure 3:
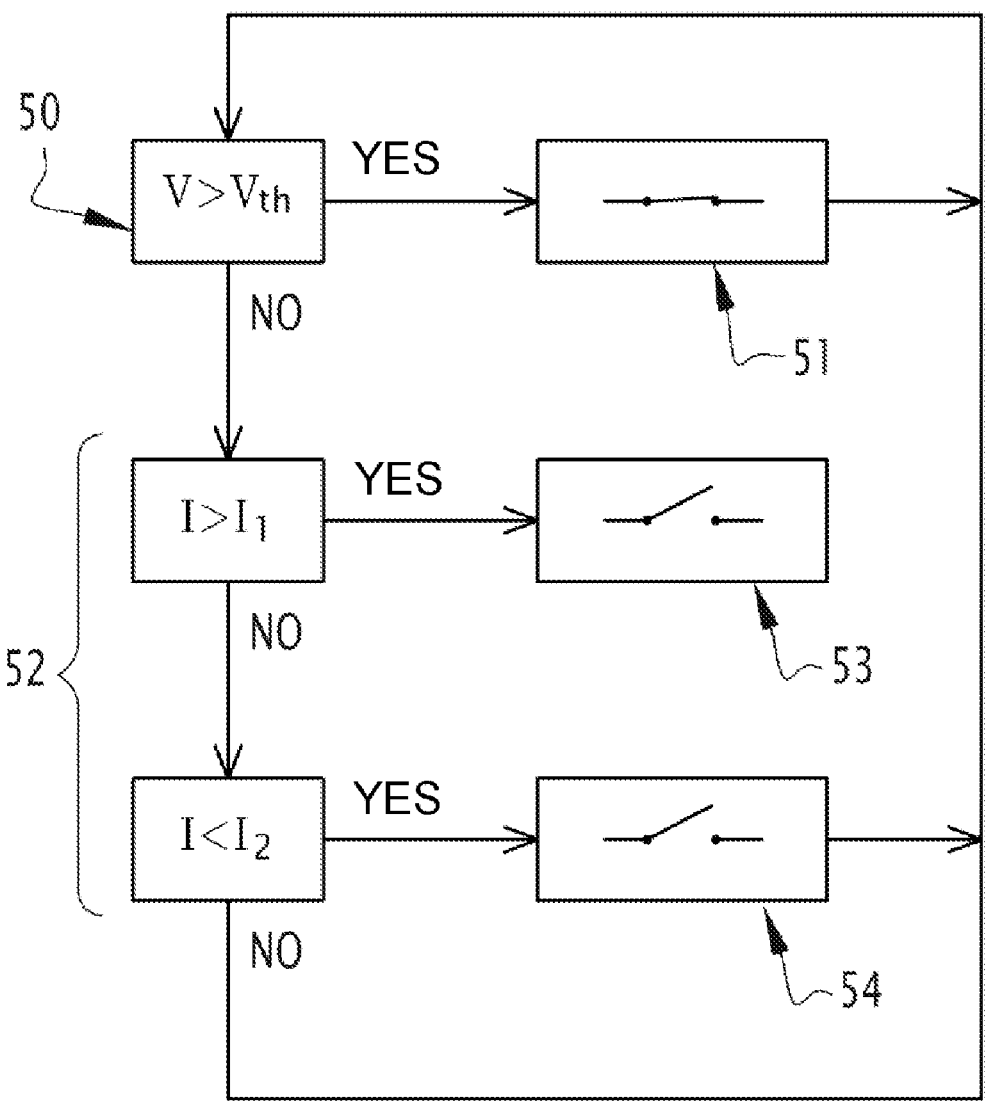
FIG. 3 is a flow diagram of a method for controlling the electronic protection device, conforming to the invention.

The operation of the protection device 10 according to the invention will now be explained in light of FIG. 3 representing a flow diagram of the method for controlling the protection device 10 according to the invention.

A step 50 consists in measuring the voltage V, via the voltage sensor 25, and evaluating it. If the voltage V is above the voltage threshold $V_{th}$, then the control module 26 performs a step 51 consisting in controlling the arrangement of at least one transistor 20 into the on state A. In this case, the protection device 10 behaves as a diode that is on, and the control module 26 uses the diode function 37 and the control function 39 to control the arrangement of at least one transistor 20.

Another step 52 consists in measuring the intensity I, via the current sensor 24, and in evaluating it. If the intensity I is above the first intensity threshold $I_1$, which corresponds to an overcurrent in the electrical circuit, then the control module 26 performs a step 53 consisting in controlling the arrangement of at least one transistor 20 via the control pole 32 into the second off state C. In this case, the protection device 10 behaves as a circuit breaker having tripped and the control module 26 uses the circuit breaker function 35 and the control function 39 to control the arrangement of at least one transistor 20 into the second off state C.

Otherwise, if the intensity I is below the first intensity threshold $I_1$ and also the second intensity threshold $I_2$, then the control module 26 performs the step 54 and controls the arrangement of at least one transistor 20 via the control pole 32 into the first off state B. In this case, the protection device 10 behaves as a reverse-blocked diode, and the control module 26 uses the diode function 37 and the control function 39 to control the arrangement of at least one transistor 20. In practice, the steps 50 and 52 advantageously take place in any order with respect to one another, or simultaneously.

Characteristics of the protection device 10 are advantageously predefined in the fabrication of the protection device 10, or modifiable, notably able to be selected by a user of the protection device 10, when using the protection device 10, typically when it is enabled. These features comprise for example a triggering curve associated with the circuit breaker function 35, as well as the threshold intensity 11. The characteristics are typically selected by the user according to a rated intensity of the current circulating in the electrical circuit in order to optimise the operation of the protection device 10. Advantageously, the first intensity threshold $I_1$ lies between two and twenty times the rated intensity circulating in the electrical circuit. The second intensity threshold $I_2$ is distinct from the first intensity threshold $I_1$, advantageously below the first intensity threshold $I_1$; ideally the second intensity threshold $I_2$ lies between −0.1% of the rated intensity and OA. The voltage threshold $V_{th}$ advantageously lies between 0V and 1V. Alternatively, the protection device 10 is capable of autonomously determining the characteristics, and notably the characteristics optimal to its operation, by virtue of the measurement of the voltage V and of the intensity I.

In the example of FIG. 1, the power supply of the load 3 is redundant, that is to say that the multiple sources 12 and 13 are connected to the protection devices 10, each protection device 10 being linked to the load 3. Thus, the sources 12 and 13 are linked in parallel to the load 3. In the case of an overcurrent in one of the electrical circuits, the circulation of the current in this circuit is cut. However, the other two circuits operate normally, the circulation of the current in these two circuits is not therefore cut, and they continue to power the load 3. Thus, the load 3 does not experience any interruption of electrical power supply in the case of overcurrent in one of the multiple electrical circuits by virtue of the redundancy of the power supplies. The fact that each protection device 10 is adapted to fulfil the diode function 37 also makes it possible to obtain so-called "diode OR" ("ORing") architectures, in addition to ensuring protection against a polarity reversal. That notably makes it possible to ensure a continuity of the electrical power supply of the load 3 in the case of failure on one of the electrical circuits resulting in the circulation of the electrical current in this circuit being stopped, this failure being able to be of a type other than an overcurrent. That also makes it possible to avoid a circulation of current between the converters 5, in the case where one of the converters 5 has a voltage different from the others, or between the sources 13 placed in parallel, in the case where each protection device 10 is directly linked to its corresponding direct energy source 13.

Thus, the protection device 10 makes it possible to combine a circuit breaker, implemented in the form of an SSCB, and a diode, without having to use two separate components, by incorporating the diode in the form of a diode function 37 in the SSCB. The protection device 10 is adapted to protect the load 3 against overcurrents in the circuit, and also against polarity reversals. The protection device is also adapted to protect current reversals from the load to the circuit, in the case of a bad connection for example. The incorporation of the diode in the protection device 10 makes it possible to save the electrical energy usually consumed by a real diode, and therefore to reduce the losses in the electrical system. That also makes it possible to save on the cost of the diode, and to reduce the bulk linked to the diode and to ancillary components which are associated with it, such as a cooler.

The protection device 10 also has applications for redundant power supply systems, by making it possible to ensure the continuity of the electrical power supply of the load 3, even in the case of failure of one of the power supply circuits.

The invention claimed is:

1. An electronic device for protecting an electrical load against an overcurrent of an electrical current, the electronic device comprising:

an arrangement of at least one transistor designed to be connected in series with the load, the arrangement of at least one transistor comprising two conduction poles and a control pole and being controllable, via its control pole, into a state out of an on state in which the current circulates between the conduction poles, and an off state in which the current does not circulate between the conduction poles, the off state being from among a first off state and a second off state;

a current sensor configured to measure an intensity of the current intended to circulate through the load;

a control module connected to the current sensor and configured to control the arrangement of at least one transistor via its control pole, the control module being configured to control the arrangement of at least one transistor into its second off state if the intensity of the current, measured by the current sensor, is above a first intensity threshold; and a voltage sensor connected to the control module, and configured to measure a voltage between the conduction poles of the arrangement of at least one transistor, wherein the control module is further configured to control the arrangement of at least one transistor into its on state from its first off state if the voltage between the conduction poles, measured by the voltage sensor, is above a voltage threshold; and into its first off state if the intensity of the current, measured by the current sensor, is below a second intensity threshold, distinct from the first intensity threshold.

2. The electronic device according to claim 1, wherein the arrangement of at least one transistor is configured to revert to the on state from the second off state only following rearming by a user, and the control module is configured to maintain the arrangement of at least one transistor in the second off state in the absence of rearming by the user.

3. The electronic device according to claim 1, wherein the arrangement of at least one transistor comprises several transistors connected in series and/or in parallel.

4. The electronic device according to claim 1, wherein the electronic device further comprises an energy dissipation module connected in parallel to the arrangement of at least one transistor, the dissipation module being configured to dissipate a magnetic energy associated with the electrical current, upon switching of the arrangement of at least one transistor into its off state.

5. The electronic device according to claim 1, wherein the second intensity threshold is below the first intensity threshold.

6. A power supply system of an electrical load, the power supply system comprising:

a plurality of electrical energy conversion devices, each conversion device being designed to be connected to a corresponding electrical energy source, each conversion device being configured to convert a first electrical energy received as input from the respective source into a second electrical energy delivered as output, and a plurality of electronic devices, each electronic device being connected at the output of a respective conversion device and designed to be connected to the electrical load to supply to it the second electrical energy delivered by the respective conversion device, wherein each electronic device is according to claim 1.

7. The power supply system according to claim 6, wherein at least one conversion device is a device for converting alternating electrical energy into direct electrical energy.

8. The power supply system according to claim 6, wherein at least one conversion device is a device for converting direct electrical energy into direct electrical energy.

9. A method for controlling an electronic device for protecting an electrical load against an overcurrent of an electrical current, the method comprising:

measuring, by a current sensor, an intensity of current circulating through the load connected in series to an arrangement of at least one transistor comprising two conduction poles and a control pole, wherein the arrangement of at least one transistor is controllable, via its control pole, into a state out of an on state in which the current circulates between the conduction poles, and an off state in which the current does not circulate between the conduction poles, the off state being from among a first off state and a second off state;

controlling, by a control module, the arrangement of at least one transistor into its second off state if the intensity of the current, measured by the current sensor, is above a first intensity threshold;

measuring, by a voltage sensor, a voltage between the conduction poles of the arrangement of at least one transistor;

controlling the arrangement of at least one transistor into its on state from its first off state, by the control module, if the voltage between the conduction poles, measured by the voltage sensor, is above a voltage threshold; and controlling the arrangement of at least one transistor into its first off state by the control module, if the intensity of the current, measured by the current sensor, is below a second intensity threshold, distinct from the first intensity threshold.

10. The method according to claim 9, wherein values of the voltage threshold, of the first intensity threshold and of the second intensity threshold are modifiable by a user, when using the electronic electronic device.

11. The method according to claim 9, further comprising reverting the arrangement of at least one transistor to the on state from the second off state only following rearming by a user.

12. The method according to claim 11, further comprising maintaining the arrangement of at least one transistor in the second off state in the absence of rearming by the user.

13. The method according to claim 9, wherein the arrangement of at least one transistor comprises several transistors connected in series and/or in parallel.

14. The method according to claim 9, further comprising dissipating a magnetic energy using an energy dissipation module connected in parallel to the arrangement of at least one transistor.

15. The method according to claim 14, wherein dissipating the magnetic energy is performed after switching of the arrangement of at least one transistor into its off state.

16. The method according to claim 9, wherein the second intensity threshold is below the first intensity threshold.

17. The method according to claim 9, further comprising converting a first electrical energy received as input from an electrical energy source into a second electrical energy using a conversion device.

18. The method according to claim 17, wherein the conversion device is configured to convert alternating electrical energy into direct electrical energy.

19. The method according to claim 17, wherein the conversion device is configured to convert direct electrical energy into direct electrical energy.

20. The method according to claim 9, wherein the arrangement of at least one transistor comprises an insulated gate bipolar transistor (IGBT).

* * * * *